(12) United States Patent
Kaiponen

(10) Patent No.: US 6,469,673 B2
(45) Date of Patent: Oct. 22, 2002

(54) ANTENNA CIRCUIT ARRANGEMENT AND TESTING METHOD

(75) Inventor: Teemu Kaiponen, Oulu (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/892,249

(22) Filed: Jun. 27, 2001

(65) Prior Publication Data
US 2002/0000939 A1 Jan. 3, 2002

(30) Foreign Application Priority Data
Jun. 30, 2000 (FI) .................................................. 001562

(51) Int. Cl.⁷ .............................. H01Q 1/24; H01Q 1/36
(52) U.S. Cl. ................................ 343/703; 343/700 MS; 343/702
(58) Field of Search ........................... 455/575; 343/703, 343/700 MS, 702; H01Q 1/36, 1/38

(56) References Cited

FOREIGN PATENT DOCUMENTS

EP 0619619 10/1994
EP 0764997 3/1997

OTHER PUBLICATIONS

"Small Antennas" ISBN 0863800483, pp. 116–151.

*Primary Examiner*—Michael C. Wimer
(74) *Attorney, Agent, or Firm*—Perman & Green, LLP

(57) ABSTRACT

The invention concerns generally the technological field of planar antenna arrangements in portable radio devices. Especially but not exclusively the invention concerns inverted-F antenna arrangements. The invention also concerns a portable radio device equipped with such a planar antenna arrangement. And additionally the invention concerns a method for producing and testing a portable radio device comprising a planar antenna. One idea of the present invention is providing an aperture (322) in the radiator element (316) of the planar antenna. An RF test point (324) is also provided for aligning the RF electronics, and the RF test point is located in such a way related to the aperture of the radiator that the test signal (320) is easily led through the aperture. It is further advantageous that an RF switch (324, 326) is provided for coupling/decoupling a connection between the planar antenna and the RF electronics. In a preferred embodiment the RF switch is integrated with the RF test point. The inventive arrangement thus allows testing the RF electronics after the radiator plate (316) has been attached to the printed wired board (334).

16 Claims, 4 Drawing Sheets

ANTENNA CIRCUIT ARRANGEMENT AND TESTING METHOD

TECHNICAL FIELD OF THE INVENTION

The invention concerns generally the technological field of planar antenna arrangements in portable radio devices. Especially but not exclusively the invention concern s inverted-F antenna arrangements. The invention also concerns a portable radio device equipped with such a planar antenna arrangement. And, additionally the invention concerns a method for assembling and testing a portable radio device comprising a planar antenna.

BACKGROUND ART OF THE INVENTION

Low profile antennas such as planar antennas are well known in the art. One of the known and widely applicable planar antenna solutions used in mobile telephones is the PIFA or Planar Inverted F Antenna. It consists of a planar conductive sheet (that may have a smooth outer contour or comprise various cuts) that acts as a radiator, and a planar conductive ground surface which is essentially parallel to the radiator. The surfaces need not be exactly planar, and they need not be exactly parallel to each other. There are one or a few conductive connections between the radiator and the ground surface, usually implemented as conductive pins or strips that are essentially perpendicular to the direction of the planar surfaces. A feeding pin or a feeding strip coupled to a certain feeding point of the planar radiator serves to couple the antenna to the antenna port of a radio device.

An example of an inverted-F antenna is shown in FIG. 1 of the accompanying drawings. The antenna 10 comprises a feed section 12 coupled to a short circuited inductive stub 14 and a capacitive line 16. The inductive stub 14 is short circuited to a ground plane 18, above which the feed section 12 protrudes by a distance D. The ground plane 18 is open to allow access for the feed section 12 which is electrically isolated from 11 from the ground plane 18. The respective lengths L1, L2, of the inductive stub 14 and the capacitive line 16 are determined to give a desired resonanc e frequency and input impedance $Z_{in}$ seen from the antenna feed point 12. The input impedance is dependant upon the position of the feed section 12 and hence the lengths L1 and L2, a nd can be made substantially resistive. Further details regarding inverted-L or -F antennas may be found in "Small Antennas" ISBN 0863 80 048 3, pages 1116–151.

Inverted F-antenna s have found particular applications in the portable radio devices, and especially mobile telephones where their high gain and omni-directional radiation patterns are particularly suitable. They are also suitable in applications where good frequency selectivity is required. Additionally, since the antennas are relatively small at typical radio telephone frequencies they can be incorporated within the housing of a radio telephone thereby not interfering with the overall aesthetic appeal of the radio telephone and giving it a more attractive appearance than radio telephones having external antennas. By placing the antenna inside the housing of a radio telephone, the antenna is also less likely to be damaged and therefore have a longer life time. The ground plane of an inverted-F antenna can be made on a printed wired board, and thus the inverted-F antenna lends itself to planar fabrication on printed wired board typically used in radio telephones.

FIG. 2 illustrates a known PIFA construction and its use in a mobile telephone, which in FIG. 1 is seen in an opened position so that its keypad, display, microphone and loudspeaker which are located on the distant side of the right-hand part are not seen. The functional parts of the mobile telephone 201 have been constructed onto a printed wired board or PWB 202. The PWB with all the components attached thereto has been enclosed into an outer cover 203 which consists of two halves 203a and 203b and also serves as a support structure. The PWB 202 is attached to the front half 203a of the outer cover. At the top end of the PWB 202 there is an antenna feeding pad 204 and a ground plane 205 which are parts of the conductive structures formed on the planar surface of the PWB. In most mobile telephones and other small radio devices the PWB is of the multilayer type in which case the ground plane 205 could be also located at one of the inner layers.

At the top end of the inside of the cover there is a conductive radiator 206. A feeding pin 207 and a grounding pin 208 protrude from the conductive radiator 206 into a direction which is towards the PWB 202 when the parts 206, 103a and 103b are attached together. When the cover is closed, the conductive radiator 206 and the ground plane 205 come into a parallel configuration and the feeding pin 207 and grounding pin 208 touch the antenna feeding pad 204 and ground plane 205 respectively, so a PIFA antenna is produced. The back cover 203b must be electrically non-conductive at least at its top end where the conductive radiator 206 is located.

Despite the small size of planar antennas, the fact that radio telephones are becoming smaller and smaller and more complex necessitating a greater amount of electronics within the housing, the space available for the inverted-F antenna is getting smaller and it is more difficult to conviniently fit such antennas into the housing.

Another problem with using an inverted-F antenna is related to manufacturing and especially testing the radio device. The testing phase of a radio telephone normally comprises alignment and galvanically measured tests of the RF electronics. This is normally made before the antenna is assembled by connecting an RF test probe in contact points of the antenna. After this phase of testing the RF test probe is disconnected and the antenna is assembled and connected in place. Finally, the function of the antenna is tested using a coupler. In a mass production of radio devices such as radio telephones it is advatageous to use automated assembling and testing. Therefore it is a drawback that the RF electronics and the antenna must be tested separately having an assembly phase between the test phases. Therefore, in an automated manufacturing the radio telephone should be first placed on an automated assembly line for assembling the electronics, then on an automated testing bench for testing the (RF) electronics, and after testing the electronics the equipment should be placed on a next assembly line for assembling the antenna, and finally the equipment should be again placed on a test bench for testing the antenna. Having so many assembling/testing phases causes additional time and costs for the manufacturing of radio telephones.

SUMMARY OF THE INVENTION

It is an object of the present invention to provide a planar antenna structure with which the disadvantages of prior art solutions would be reduced or avoided. It is especially an object of the present invention that the antenna structure is applicable to large scale mass production of radio devices, including testing.

One idea of the present invention is providing an aperture in the radiator plate of the planar antenna. An RF test point is provided for aligning the RF electronics and the RF test point is located in such a way related to the aperture of the radiator that the test signal is easily led through the aperture. It is further advantageous that an RF switch is provided for coupling/decoupling a connection between the planar antenna and the RF electronics. In a preferred embodiment the RF switch is integrated with the RF test point. The inventive arrangement thus allows testing the RF electronics after the radiator plate has been attached to the PWB.

The present invention has important advantages over the prior art. The tuning and testing of the radio device can be made with a single automatic arrangement, and it is necessary to attach the device to the test bench just once. It is also possible to make the automatic assembly work on a single line before the testing/tuning procedure; It is not necessary to make any substantial assembly work after the testing/ tuning procedure. As a result, it is possible by using the present invention to provide assembly and testing procedures where substantially all assembly work can be done without intermediate testing phases and all testing can be done without intermediate assembly phases.

If the aperture is a hole, ie. it is bordered by the radiator element of the antenna, the hole does not have a significant negative effect on the radiation properties of the antenna. However, placing the RF switch and test point under the radiator element saves space on the printed wired board and the radio device such as radio telepone can be designed smaller.

The antenna circuit arrangement according to the invention comprises
  a planar antenna with a ground plane and a planar radiator element and disposed substantially parallel to the ground plane, and
  an RF circuit coupled to the planar antenna for processing RF signals received by the planar antenna and/or RF signals to be transmitted by the antenna. It is characterized in that
  the antenna circuit arrangement comprises a test point for connecting a test signal to/from the RF circuit, and
  an aperture in the planar radiator element for conveying said test signal through said aperture.

The invention applies also to a portable radio device comprising an antenna arrangement, and further comprising
  a planar antenna with a ground plane and a planar radiator element and disposed substantially parallel to the ground plane, and
  an RF circuit coupled to the planar antenna for processing RF signals received by the planar antenna and/or RF signals to be transmitted by the antenna. It is characterized in that
  the antenna circuit arrangement comprises a test point for connecting a test signal to/from the RF circuit, and
  an aperture in the planar radiator element for conveying said test signal through said aperture.

The invention also concerns a method for assembling and testing an antenna arrangement including a planar antenna and RF electronics, the planar antenna comprising a ground plane and a planar radiator, wherein
  the RF electronics is assembled,
  the planar radiator is attached to the RF electronics assembly,
  the RF electronics is tested by connecting a test signal to/from the RF-electronics which is decoupled from the planar antenna,
  the planar planar antenna is coupled to the RF electronics, and
  the planar antenna is tested when the planar antenna is coupled to the RF electronics. It is characterized in that in said step of testing the RF electronics a test signal is conveyed through an aperture of the radiator plane of the planar antenna to/from a test point of the RF electronics.

Definitions "radiator plane" and "radiator element" are used here, but these definitions are not meant to restrict the function of the element of the antenna to RF transmission, but the definition also includes elements of antennas that are used for RF reception.

BRIEF DESCRIPTION OF THE DRAWINGS

The novel features which are considered as characteristic of the invention are set forth in particular in the appended Claims. The invention itself, however, both as to its construction and its method of operation, together with additional objects and advantages thereof, will be best understood from the following description of specific embodiments when read in connection with the accompanying drawings.

DETAILED DESCRIPTION

Figure 1:
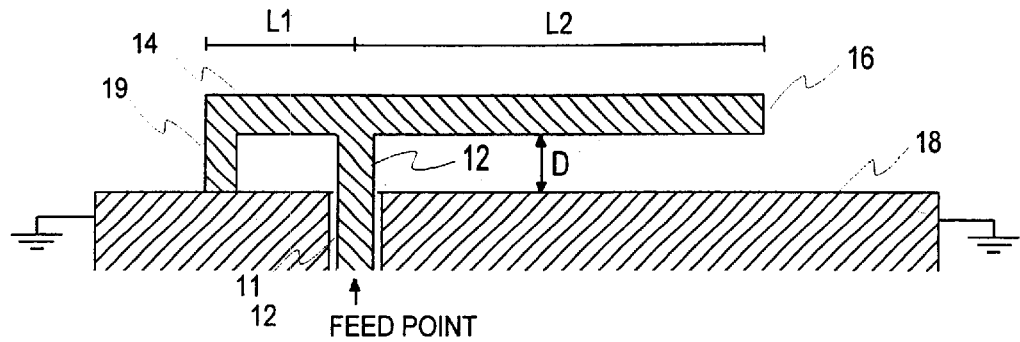
FIG. 1 illustrates a prior art planar antenna.
Figure 2:
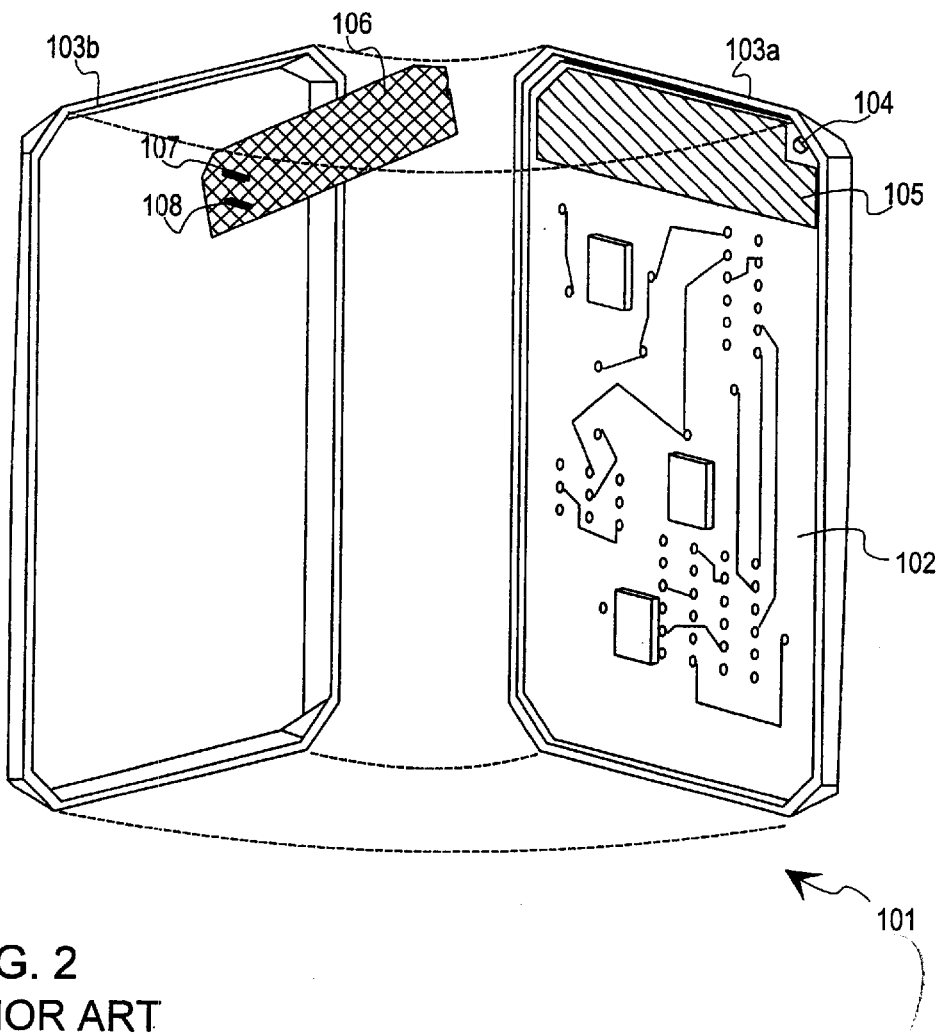
FIG. 2 illustrates a prior art planar antenna construction in a mobile telephone.

FIGS. 1 and 2 were already described in the prior art description above.

Figure 3:
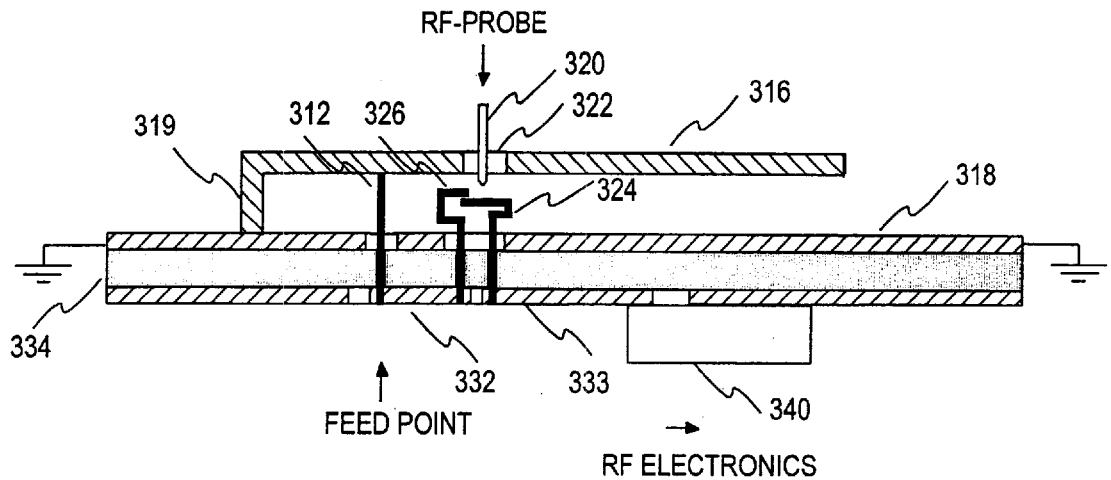
FIG. 3 illustrates a cross section of an examplary planar-F antenna according to the invention.

FIG. 3 illustrates a cross section of an examplary planar antenna arrangement according to the present invention. It comprises a ground plane 318 on a printed wired board 334, and a radiator element 316 which is connected to the ground plane from its edge, 319. The feed point of the radiator element is connected with a pin 312 to a printed wire 332 of the PWB which is further connected to the first contact part 326 of the RF switch. The second contact part 324 of the RF switch is connected to a printed wire 333 which is further connected to a duplex filter 340 of the RF electronics.

According to the present invention there is an aperture 322 on the radiator element 316 for connecting an RF test probe to the RF test point 324. The RF test point is integrated to the RF switch so that it is possible to decouple the connection between the radiator element and the RF electronics by disconnecting the switch by pressing the RF probe against the test point of the switch. As the antenna is thus disconnected it is possible to test the racaiver ad transmitter parts of the RF electronics by using the RF probe for feeding a test signal to the receiver circuit and for measuring an output signal from the transmitter circuit.

Figure 4:
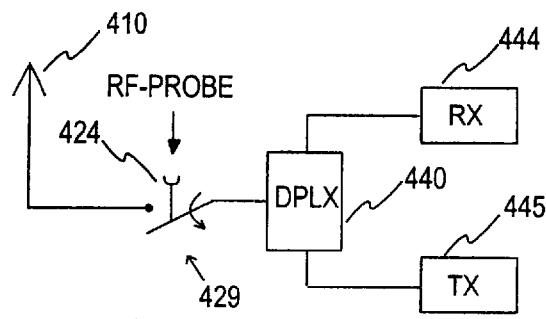
FIG. 4 illustrates electrical coupling of a planar antenna to other RF circuitry.

FIG. 4 illustrates a circuit block diagram of an examplary circuit arrangement according to the invention. The radiator element of the antenna 410 is connected to the RF switch 429 which couples/decouples the antenna to the duplex filter 440. The duplex filter couples the signals of the receiving frequency band from the RF switch to the receiving (RX) part of the RF electronics 444, and the signals on the transmitting frequency band are coupled from the transmitter part of the RF electronics 445 to the RF switch. The test equipment can be connected to the test point 424 of the RF switch with an RF probe, simultaneously disconnecting the antenna from the RF electronics. The antenna can be tested with a wireless coupler after the RF electronics has been aligned and the RF probe has been disconnected from the test point 424.

Figure 5:
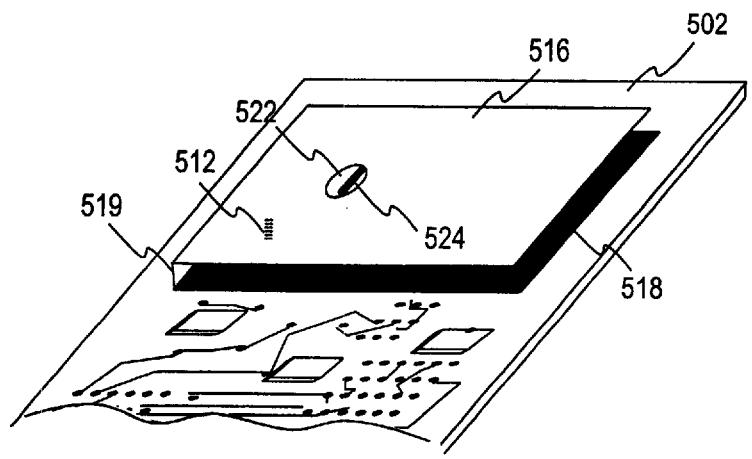
FIG. 5 illustrates a planar antenna arrangement on a printed wired board of a mobile telephone.

FIG. 5 illustrates an examplary planar antenna arrangement according to the invention on a printed wired board 502 of a mobile telephone. The radiator element 516 of the planar antenna is connected to the ground plane 518 from its edge 519, and the feed point of the radiator element is connected with a pin 512 to the PWB wiring. The radiator element has an aperture 522, through which the RF switch and the RF test point 524 can be accessed.

Figure 6:
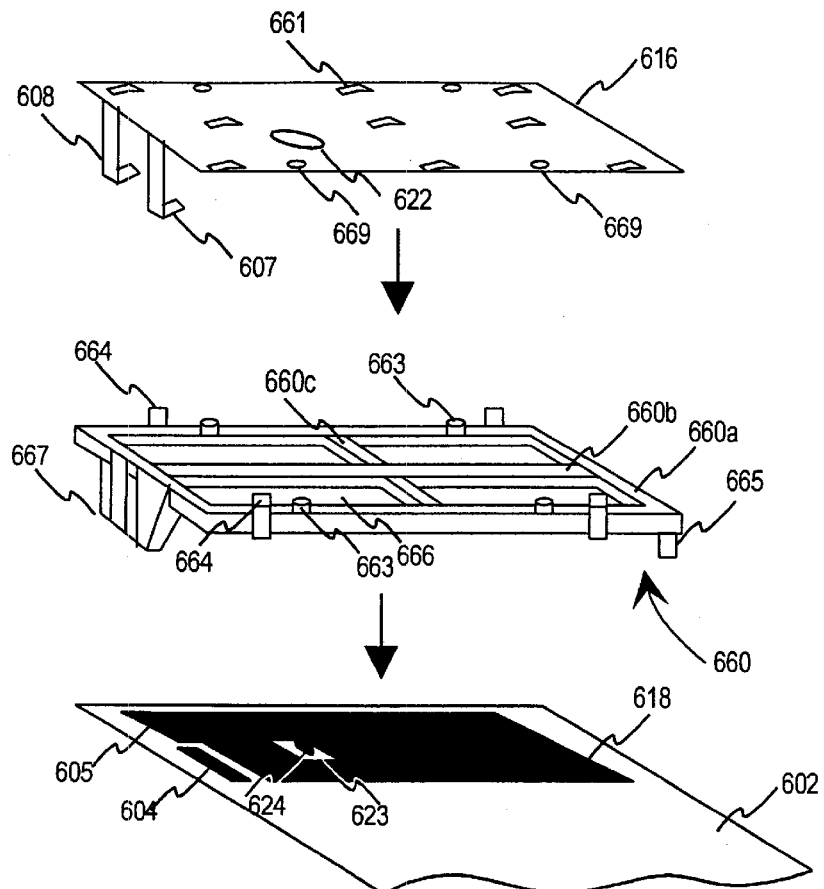
FIG. 6 illustrates an exploded view of an examplary planar antenna construction according to the invention where the radiating element is attached to a plastic support element.

FIG. 6 illustrates an exploded view of an examplary planar antenna construction according to the invention where the radiating element 604 is attached to a support frame 660. The support frame may include an outer frame 660a and a support structure 660b, 660c. The support frame is made of an electrically isolating material, such as plastic.

The radiator element 616 is attached to the support frame, and due to guide holes 669 of the radiator element and corresponding guide pins of the support frame the radiator element can be positioned accurately to the support frame. The support frame may also have pins 664 for attaching the frame to the cover of the device. The radiator element can be set to suitable distance from the ground plane with support legs 665 and 667. The ground pin 608 and the feed pin 607 are made by punching and bending from the antenna plate material. When the radiator element and the support frame are attached to the printed wired board 602 the ground pin 608 and the feed pin 607 connect to the corresponding contact areas 605 and 604 on the PWB. The printed wired board also comprises the ground plane 618 and the RF switch/test point 624 which is isolated 623 from the ground plane 618.

The radiator element has an aperture 622 according to the invention. Also the support frame has a hole 666 so that the RF switch/test point 624 can be accessed through the holes 622 and 666.

Figures 7A, 7B:
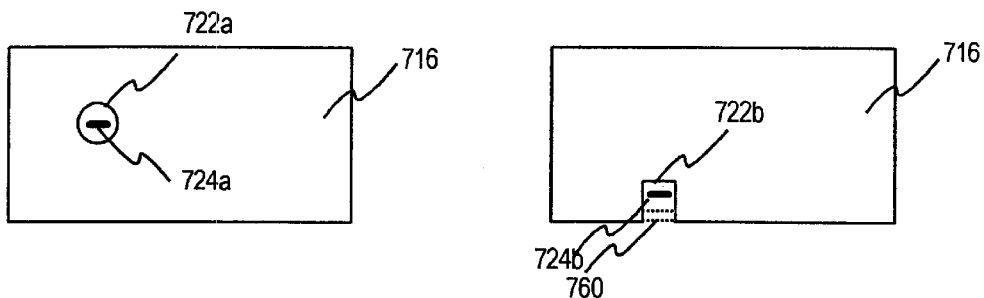
FIG. 7A illustrates a top view of an inverted F-antenna where the aperture is a hole.
FIG. 7B illustrates a top view of an inverted F-antenna where the aperture is bordered by the radiating element from three sides.
Figure 7C:
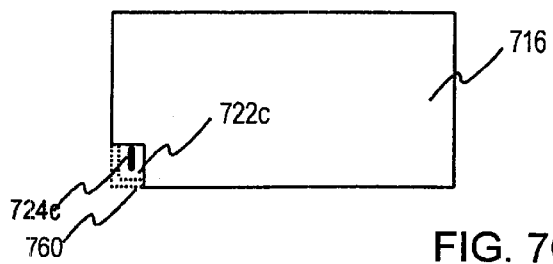
FIG. 7C illustrates a top view of an inverted F-antenna where the aperture is bordered by the radiating element from two sides.

FIGS. 7A, 7B and 7C illustrate different embodiments of a radiator element. In FIG. 7A the aperture 722a is located within the radiator plate 716 thus forming a hole. The RF switch/test oint 724a is shown within the hole. When the aperture is a hole, there is the advantage that the RF currents may flow around the hole and therefore the hole may have a very small negative effect on the radiation. Especially, if the hole is near to the center of the radiator plate, the effect of the hole to the radiation in minimal.

FIG. 7B illustrates an embodiment where the aperture 722b is bordered by the radiator element 716 from three sides. A support frame 760 can be seen at the edge of the aperture.

FIG. 7C illustrates an embodiment where the aperture 722c in in the corner of the radiator plate and thus it is bordered by the radiator element 716 from two sides. A support frame 760 can be seen at two other sides of the aperture.

Figure 8:
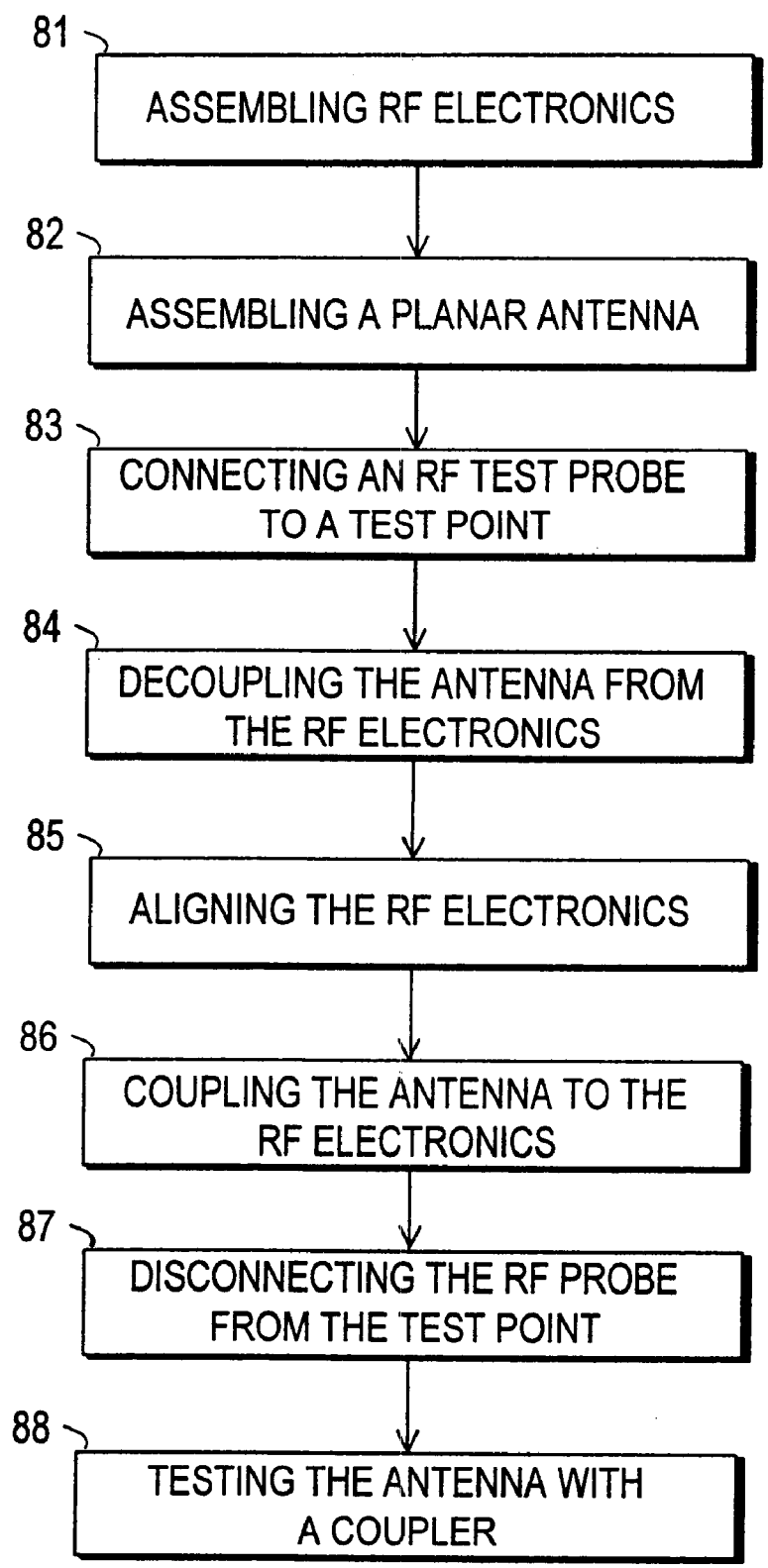
FIG. 8 illustrates a flow diagram of a method for assembling and testing a radio device.

FIG. 8 illustrates a flow diagram of an examplary method for assembling and testing a radio device according to the invention. The RF electronics are first assembled 81, and the radiator element of the planar antenna is assembled, 82, together with or after the assembly phase of the RF electronics. After the assembly phases an RF probe is connected to the RF test point through the aperture of the radiator element, 83. The antenna is electrically decoupled from the RF electronics by pressing the test point with the RF probe causing the FR switch to open, 84. After the antenna has been decoupled, the RF electronics is aligned, 85. After aligning the RF electronics the RF probe is disconnected from the test point causing the antenna to be coupled to the RF electronics, 86, 87. The antenna is finally tested advantageously with a coupler, 88.

It is to be understood that the embodiments and variations shown and described herein are merely illustrative of the principles of this invention and that various modifications may be implemented by those skilled in the art without departing from the scope and spirit of the invention. Especially, it is to be understood that the present invention is not in any way restricted to the mentioned forms or assemblies of the illustrated devices. And even if the described embodiments have concerned inverted-F antennas, it is clear thet the invention can be applied with any kind of planar antenna structures.

I claim:

1. An antenna circuit arrangement, comprising
   a planar antenna with a ground plane and a planar radiator element and disposed substantially parallel to the ground plane, and
   an RF circuit coupled to the planar antenna for processing RF signals received by the planar antenna and/or RF signals to be transmitted by the antenna, characterized in that
     the antenna circuit arrangement comprises a test point for connecting a test signal to/from the RF circuit, and
     an aperture in the planar radiator element for conveying said test signal through said aperture.

2. An antenna arrangement according to claim 1, characterized in that the aperture is located at the line perpendicular to the plane of the radiator element which line touches said test point.

3. An antenna arrangement according to claim 1, characterized in that the antenna circuit arrangement comprises a switch for coupling and decoupling a contact between the planar radiator element and the RF circuit.

4. An antenna arrangement according to claim 3, characterized in that said switch is integrated with said test point.

5. An antenna arrangement according to claim 3, characterized in that said switch is switchable through said aperture.

6. An antenna arrangement according to claim 5, characterized in that said contact is arranged to be decoupled by pressing said test point, and said contact is arranged to be coupled when said pressure is removed.

7. An antenna arrangement according to claim 1, characterized in that said aperture is bordered by the radiator element conductive member from at least two sides of the aperture.

8. An antenna arrangement according to claim 1, characterized in that said aperture is bordered by the radiator element conductive member from at least three sides of the aperture.

9. An antenna arrangement according to claim 1, characterized in that said aperture is a hole.

10. A portable radio device comprising an antenna arrangement, further comprising:

a planar antenna with a ground plane and a planar radiator element and disposed substantially parallel to the ground plane, and an RF circuit coupled to the planar antenna for processing RF signals received by the planar antenna and/or RF signals to be transmitted by the antenna, characterized in that the antenna circuit arrangement comprises a test point for connecting a test signal to/from the RF circuit, and an aperture in the planar radiator element for conveying said test signal through said aperture.

11. A portable radio device according to claim 10, characterized in that it is a mobile telephone.

12. A method for assembling and testing an antenna arrangement including a planar antenna and RF electronics, the planar antenna comprising a ground plane and a planar radiator which is substantially parallel with the ground plane, wherein the RF electronics is assembled, the planar radiator is attached to the RF electronics assembly, the RF electronics is tested by connecting a test signal to/from the RF-electronics which is decoupled from the planar antenna, the planar planar antenna is coupled to the RF electronics, and the planar antenna is tested when the planar antenna is coupled to the RF electronics, characterized in that in said step of testing the RF electronics a test signal is conveyed through an aperture of the radiator plane of the planar antenna to/from a test point of the RF electronics.

13. A method according to claim 12, characterized in that said steps of coupling and decoupling the antenna with the RF electronics is made by setting a switch between the planar antenna and the RF electronics in coupled/decoupled positions.

14. A method according to claim 13, characterized in that said switch is integrated with said test point.

15. A method according to claim 14, characterized in that testing the RF electronics comprises the steps of connecting an RF probe to the test point, decoupling the switch by pressing the test point, aligning the RF electronics by conveying test signals to/from the RF electronics through the RF probe and the aperture of the radiating element, and disconnecting the RF probe from the test point and letting said switch be recoupled.

16. A method according to claim 12, characterized in that the testing the planar antenna comprises the steps of wireless transfer of a test signal between a test circuit and the planar antenna which is coupled to the RF electronics.

* * * * *